United States Patent [19]

Hupe et al.

[11] Patent Number: 5,145,572
[45] Date of Patent: Sep. 8, 1992

[54] PROCESS FOR MANUFACTURING THROUGH-HOLE CONTACTING PLATED PRINTED CIRCUIT

[75] Inventors: Jurgen Hupe, Langenfeld; Herbert Iwan, Solingen, both of Fed. Rep. of Germany

[73] Assignee: Blasberg Oberflachentechnik GmbH, Solingen-Merscheid, Fed. Rep. of Germany

[21] Appl. No.: 803,899

[22] Filed: Dec. 9, 1991

Related U.S. Application Data

[63] Continuation of Ser. No. 530,277, May 30, 1990, abandoned, which is a continuation-in-part of PCT/EP88/01112, Dec. 7, 1988.

[30] Foreign Application Priority Data

Dec. 8, 1987 [DE] Fed. Rep. of Germany ....... 3741459

[51] Int. Cl.$^5$ ............................................. C25D 5/34
[52] U.S. Cl. .................................... 205/219; 205/210; 205/184; 205/187; 29/852
[58] Field of Search ................ 205/219, 210, 184, 187

[56] References Cited

U.S. PATENT DOCUMENTS

| | | |
|---|---|---|
| 3,099,608 | 7/1963 | Radovsky et al. . |
| 3,194,681 | 7/1965 | Nicholson et al. .................. 205/125 |
| 4,622,108 | 11/1986 | Polakovic et al. . |
| 4,683,036 | 7/1987 | Morrissey et al. .................. 205/125 |
| 4,749,449 | 6/1988 | Scott ..................... 205/136 |
| 4,891,069 | 1/1990 | Holtzman et al. .................. 205/184 |
| 4,895,739 | 1/1990 | Bladon ............................... 205/125 |

FOREIGN PATENT DOCUMENTS

| | | |
|---|---|---|
| 0248683 | 12/1987 | European Pat. Off. . |
| 3304004 | 8/1984 | Fed. Rep. of Germany . |
| 2123036 | 1/1984 | United Kingdom . |

OTHER PUBLICATIONS

Lowenheim, F. A., "Electroplating", McGraw-Hill, New York, 1978, pp. 78–79.

*Primary Examiner*—John Niebling
*Assistant Examiner*—Kishor Mayekar
*Attorney, Agent, or Firm*—Wegner, Cantor, Mueller & Player

[57] ABSTRACT

The process for manufacturing through-hole contacting plated printed circuit boards by direct metal electrodeposition on catalytically activated surfaces of the substrate material is improved by pre-treatment prior to electrodepositing the metal, preferably with a solution containing one or more nitrogen-containing organic compounds.

9 Claims, No Drawings

PROCESS FOR MANUFACTURING THROUGH-HOLE CONTACTING PLATED PRINTED CIRCUIT

This application is a continuation of U.S. application Ser. No. 07/530,277 filed May 30, 1990, now abandoned, which is a continuation-in-part of PCT/EP88/01112, filed Dec. 7, 1988.

The present invention relates to a process for manufacturing through-hole contacting plated printed circuit boards by direct metal electrodeposition on catalytically activated surfaces of the substrate material.

In practice, through-hole contacting plated printed circuit boards so far have been produced not by direct metal electrodeposition, but by chemical metal deposition on catalytically activated surfaces of a substrate material. If desired or required, these chemically deposited metal layers are subsequently reinforced by an electrodeposition of metal. This technology has in fact proven to be useful and leads to high-grade circuit boards. Nevertheless, some drawbacks are inherent to this technology, but so far one has had to put up with these drawbacks because of a lack of feasible alternatives. Above all it is the method using no external current, and, thus, merely chemical metal deposition in reducing baths which is very expensive and requires an accurate bath analysis and bath control. The involved chemical metallization baths also contain very expensive chemicals. Nevertheless, the layers deposited in this way have a physical and mechanical quality which is inferior to those metal layers having been galvanically deposited. Another disadvantage of the technology employed so far is the uncertainty in the stabilization of the systems and also the uncertainty of whether the deposition rate and layer thickness on the walls inside the bore holes are sufficiently reproducible. Moreover, the baths used mostly contain formaldehyde as reducing agent which has, in the meantime, been found to be hazardous to health. Furthermore, these chemical metallization baths contain larger amounts of complexing agents which are poorly biodegradable and, therefore, constitute a serious contamination of the waste water.

Therefore it has long been attempted to avoid this chemical metallization and, instead, to carry out a direct electrodeposition of the metal. Such a process has been described, for example, in U.S. patent specification No. 3,099,608, as well as in the German Published Unexamined Patent Application (DE-OS) 33 04 004. However, said processes have not been adopted in practice. Repeated study of these processes by Applicants revealed that reasonably usable results were obtained only with freshly prepared galvanic metallization baths. Very soon after beginning of the operation in such a galvanic metallization bath the quality of the metal deposits obtained is so much decreased that the products attained are no longer usable. Furthermore, the observation in U.S. Pat. No. 3,099,608 was confirmed that the metal deposition requires relatively long periods of time, i.e. at least 20 minutes. However, above all, defects in the metallization are encountered very soon and to an increasing degree, and metal layers are obtained which exhibit an insufficient adhesion on the walls of the holes.

It is the object of the invention to develop a process for manufacturing through-hole contacting plated printed circuit boards by direct metal electrodeposition on catalytically activated surfaces of the substrate material, which process rapidly and inexpensively results in the formation of products of a quality which is comparable to that of the products known so far and wherein the metallization baths may be used for a sufficiently long period of time.

This object can be attained in a surprisingly simple manner by pretreating the catalytically activated surfaces prior to electrodepositing the metal, preferably with a solution containing one or more nitrogen-containing organic compounds. There may be used as the nitrogen-containing organic compounds, for example, aliphatic, aromatic, heterocyclic or cycloaliphatic mono-, di- or polyamines as well as mono- or polynuclear N-containing heterocyclic compounds, which may optionally be substituted with hydroxyl, carboxyl or sulfo groups, and which optionally are present in ethoxylated, propoxylated and/or quaternized form or in the form of an acid addition salt. However, certain nitrogen-free compounds such as hydroquinone or alkoxylated phenols such as ethoxylated alkylphenols {Triton ® BG 10} are also suitable.

So far, particularly good results have been obtained with polyvinylpyrrolidones, 2,2,6,6-tetramethyl-4-piperidone, pyridiniumpropyl sulfo-betaine and/or polymeric poly-quaternary ammonium chlorides.

The effectiveness of said compounds may be further enhanced by the additional use of reducing agents such as, e.g., boron hydride, ascorbic acid, oxalic acid, hypophosphate etc. The reducing agents may also be separately employed, if desired, in a preliminary step before the pre-treatment.

Furthermore, it has been found that still better results can be achieved if the surfaces are wired as an anode or cathode for a short period during or after the pre-treatment with the solution of the nitrogen-containing organic compounds, but prior to electrodepositing the metal. So far there is no explanation for the effects caused by the nitrogen-containing organic compound and/or the short-term wiring as an anode or cathode.

However, quite obviously the catalytically activated surfaces are changed by these measures in such a manner that they are rendered capable of ensuring that a direct electrodeposition of metal is effected faster, in better reproducible mode and so that the deposited layer adheres more firmly and is more durable. Furthermore, using these measures the galvanic metal baths subsequently employed can be utilized for a long period of time without any deterioration in quality.

It has also been found that the process conditions can be further optimized by ultrasonic action during the pre-treatment with the solution containing the nitrogen-containing organic compounds and/or during the electrodeposition of the metal. The ultrasonic action probably has the effect of improving the hydrodynamics on the surface, but so far there is no exact proof for this assumption.

In carrying out the process according to the invention, the usual substrate materials may be employed. These include, more particularly, glass fiber-reinforced epoxide resin, polyimide and other solid polymers. In principle, any substrate material is suitable which is coatable with a metal layer upon catalytic activation.

The catalytic activation also is effected in a per se known manner. The activation, more specifically, is accomplished by means of noble metal-containing colloidal ionogenic or non-ionogenic catalysts, especially the known catalysts based on palladium and tin. However, other catalysts which, for example, do not contain any noble metals, are in principle suitable as well, and so are vapor-deposited catalytically active layers.

The following metal electrodeposition also is carried out with the use of known galvanic baths. In principle, all metals or alloys capable of being electrodeposited can be employed in this step. However, the use of copper electrolytes is preferred. Copper baths containing from 50 to 300 g/l of free sulfuric acid and an amount of metal of from 5 to 50 g/l are particularly preferred. However, electrolytes containing fluoroboric acid, hydrochloric acid, thiosulfate or pyrophosphate or cyanidic electrolytes as well as eleotrolytes based on sulfamines and organic sulfonic acids have also proven to be suitable.

The electrolytic deposition is effected under the conventional conditions, namely between 20° C. and 70° C. with current densities of between 0.1 to 20 A/dm$^2$. Surprisingly, the period required for the electrodeposition may be significantly shortened, namely to from 2 to 5 minutes, in particularly favorable cases. The metal layers obtained are uniform, continuous and, in addition, firmly adhering, and also do not show any defective spots in the so-called through-light test.

The through-hole contacting plated printed circuit boards produced according to the invention can be further processed in a known manner. Thus, for example, a further build-up of metallic layers may be effected by the galvanic route so that copper layers having a thickness of from 25 to 40 μm are formed, which in turn are overlaid with further metallic layers serving as etching resists. By means of the process according to the invention it is also possible first to negatively overlay the through-hole contacting plated printed circuit boards with a screen or photo print and then to produce the circuit pattern image upon exposure and development. Then the circuit structure is built up. It is further possible to selectively produce the circuit pattern image by screen or photo printing after the catalytic activation of the bored substrate material and then selectively to galvanically metallize the exposed, already activated areas. Hereby a direct buildup of the circuit board is achieved.

The pre-treatment according to the invention can be carried out especially by means of aqueous solutions or solutions in organic solvents of the nitrogen-containing organic compounds and optionally the reducing agent. The solutions usually have concentrations of from 1 to 250 g/l. Usually a few preliminary experiments will suffice to determine the optimum conditions for each catalytically activated substrate material. The additional process step of the pre-treatment requires only minor expenses, the costs of which are in no relation to the improved result achieved—also in comparison to the current methods established in use for chemical metal deposition.

The process according to the invention is further illustrated by the following examples and comparative tests.

EXAMPLE 1

A substrate of glass fiber-reinforced epoxide resin which has been copper-coated on both sides was provided in the conventional manner with bore holes, mechanically cleaned, and chemically degreased in a commercial cleansing agent {Blasolit® MSH}. Then the substrate was superficially etched with an aqueous solution of hydrogen peroxide and sulfuric acid. Next it was pickled in an about 10% solution of hydrochloric acid and subsequently activated with a commercially available catalyst system based on colloidal palladium (catalyst solution K 125 Blasberg Oberflächentechnik GmbH), followed by rinsing with water and immersion in an aqueous solution containing 10 g/l of polyvinyl pyrrolidone (K 30). After pickling with 20% sulfuric acid, electrodeposition was carried out in a commonly used copper electrolyte bath. As the electrolyte, there is employed commercial product CUPROSTAR® LP-1 (Blasberg Oberflächentechnik GmbH). This electrolyte is composed as follows:

| Copper: | 18 to 22 g/l |
|---|---|
| Sulfuric acid: | 180 to 250 g/l |
| Sodium chloride: | 60 to 100 mg/l |
| Additive used based on polyether: | 4 to 8 ml/l |

The temperature was 20° C. to 25° C., and the current density was 2 to 4 A/dm$^2$. After only 15 minutes all bore holes were completely and uniformly metallized with a firmly adhering layer.

COMPARATIVE TEST

Under the same conditions as in Example 1, copperplating was carried out directly after the activation without a pre-treatment with polyvinylpyrrolidone. After 20 minutes only a part of the bore holes was metallized. All of the bore holes showed unmetallized spots. The quality of the results very rapidly decreased with increasing age of the metallizing bath.

EXAMPLE 2

Conditioning was carried out under the same conditions as in Example 1; however, during the pre-treatment period, the substrate was wired as anode so that there was present a voltage of about 10 V during 3 minutes. Then, the copper electrodeposition was carried out in the same manner as in Example 1. After only 4.5 minutes all bore holes were completely and uniformly copper-plated with a firmly adhering layer.

EXAMPLE 3

In the same manner as described in Example 1, the activated circuit board was pre-treated with an aqueous solution of 20 g/l of a polymeric polyquaternary ammonium chloride (Mirapol WT of the company Miranol Chemical Company). After the pre-treatment, the substrate material was immersed in a 20% H$_2$SO$_4$ solution for 3 minutes and was anodically treated with a voltage of about 5 V, followed by rinsing and electrolytic copper-plating. After only 3 minutes all boreholes were completely and uniformly copper-plated with a firmly adhering layer.

EXAMPLE 4

In the same manner as described in Example 2, conditioning was effected with 1% solutions of 2,2,6,6-tetramethyl-4-piperidone hydrochloride or pyridiniumpropyl sulfo-betaine. In each case after only 4 minutes all bore holes were completely and uniformly copper-plated with a firmly adhering layer.

EXAMPLE 5

Example 3 was repeated; however, ultrasound was used during conditioning and the electrodeposition of copper. After only 2.5 minutes all bore holes were completely and uniformly copper-plated with a firmly adhering layer.

Further experiments showed that the layers thus obtained of about 25 to 40 μm in thickness could be readily electroplated with further metallic layers and, thus, subjected to further treatment in the same manner as the products previously obtained wherein the first copper layer had been chemically deposited. However, the physical properties of the copper layers produced according to the invention were clearly improved over those of layers prepared by the chemical route.

EXAMPLE 6

In the same manner as described in Example 2, the pre-treatment was carried out with 1% of solutions of nitrogen-free compounds such as, for example, hydroquinone or ethoxylated alkylphenols {Triton ® BG 10, Rohm & Haas}. In each case after only 8 minutes all bore holes were completely and uniformly copper-plated with a firmly adhering layer.

We claim:

1. A process for manufacturing through-hole plated printed circuit boards by direct metal electrodeposition on catalytically activated surfaces of the substrate material, wherein the catalytically activated surfaces are pre-treated prior to electrodepositing the metal with a solution containing one or more nitrogen-containing organic compounds, hydroquinone or ethoxylated alkylphenols and wherein the surfaces are wired as an anode or cathode during or after the pre-treatment, but prior to electrodepositing the metal.

2. The process according to claim 1, wherein there are used as the organic compounds aliphatic, aromatic, heterocyclic or cycloaliphatic mono-, di- or polyamines, or mono- or polynuclear N-containing heterocyclic compounds, all of which may optionally be substituted with hydroxyl, carboxyl or sulfo groups, and which optionally are present in ethoxylated, propoxylated or quaternized form or in the form of an acid addition salt.

3. The process according to claim 1, characterized in that there is used as the nitrogen-containing organic compound a polyvinylpyrrolidone, 2,2,6,6-tetramethyl-4-piperidone, pyridiniumpropyl sulfo-betaine or a polymeric poly-quaternary ammonium chloride.

4. The process according to claim 1, characterized in that the pre-treatment is carried out in the presence of reducing agent.

5. The process according to claim 1, characterized in that reducing agents are employed prior to the pre-treatment.

6. The process according to claim 4, characterized in that as the reducing agents there are employed boron hydride, ascorbic acid, oxalic acid, or hypophosphite.

7. The process according to claim 1, characterized in that ultrasonic action is allowed to take place during the pre-treatment or during the electrodeposition of the metal.

8. A process for manufacturing through-hole plated printed circuit boards by direct metal electrodeposition comprising
  (a) catalytically activating the surface of a substrate material,
  (b) rinsing the catalytically activated substrate obtained from (a) with water,
  (c) pre-treating the catalytically activated substrate with a solution containing one or more nitrogen-containing organic compounds, hydroquinone, or ethoxylated alkylphenols,
  (d) wiring the substrate surface as a cathode or anode for a short period of time, and
  (e) electrodepositing a metal onto the substrate surface;
  wherein each of steps (a)–(e) is sequentially performed in alphabetical order except that step (d) may be performed simultaneously with or after step (c).

9. A process according to claim 8, wherein the substrate surface is wired as a cathode or anode for about 3 minutes.

* * * * *